(12) United States Patent
Luis et al.

(10) Patent No.: US 7,196,562 B1
(45) Date of Patent: Mar. 27, 2007

(54) PROGRAMMABLE CLOCK DRIVERS THAT SUPPORT CRC ERROR CHECKING OF CONFIGURATION DATA DURING PROGRAM RESTORE OPERATIONS

(75) Inventors: Bradley C. Luis, Duluth, GA (US); Roland T. Knaack, Suwanee, GA (US); Srinivas S. B. Bamdhamravuri, Duluth, GA (US)

(73) Assignee: Integrated Device Technology, Inc., San Jose, CA (US)

( * ) Notice: Subject to any disclaimer, the term of this patent is extended or adjusted under 35 U.S.C. 154(b) by 195 days.

(21) Appl. No.: 10/979,979

(22) Filed: Nov. 3, 2004

Related U.S. Application Data

(63) Continuation-in-part of application No. 10/648,090, filed on Aug. 26, 2003, now Pat. No. 6,977,539.

(60) Provisional application No. 60/551,095, filed on Mar. 8, 2004.

(51) Int. Cl.
*H03L 7/06* (2006.01)

(52) U.S. Cl. ............... 327/156; 327/147; 327/544; 713/323

(58) Field of Classification Search .......... 327/99, 327/156–159, 147–148, 544; 713/321, 323
See application file for complete search history.

(56) References Cited

U.S. PATENT DOCUMENTS

| | | | |
|---|---|---|---|
| 5,485,490 A | 1/1996 | Leung et al. | 375/371 |
| 5,614,855 A | 3/1997 | Lee et al. | 327/158 |
| 5,684,434 A | 11/1997 | Mann et al. | 331/16 |
| 5,877,656 A | 3/1999 | Mann et al. | 331/16 |
| 6,111,445 A | 8/2000 | Zerbe et al. | 327/231 |
| 6,125,157 A | 9/2000 | Donnelly et al. | 375/371 |
| 6,215,689 B1 | 4/2001 | Chhor et al. | 365/63 |
| 6,271,702 B1 | 8/2001 | Stansell | 327/295 |
| 6,329,859 B1 | 12/2001 | Wu | 327/291 |
| 6,330,679 B1 * | 12/2001 | Conary et al. | 713/300 |
| 6,359,486 B1 | 3/2002 | Chen | 327/231 |

(Continued)

OTHER PUBLICATIONS

Rabaey, Jan M., "Synchronization at the System Level," Digital Integrated Circuits, A Design Perspective, Prentice-Hall, Inc., pp. 540-543.

(Continued)

*Primary Examiner*—Dinh T. Le
(74) *Attorney, Agent, or Firm*—Myers Bigel Sibley & Sajovec PA

(57) ABSTRACT

A packaged integrated circuit device includes a nonvolatile memory device and a programmable clock driver circuit therein. The memory device may be provided as an EEPROM device that is disposed on a first integrated circuit substrate and the programmable clock driver circuit may be disposed on a second integrated circuit substrate. The programmable clock driver circuit includes a control circuit and a clock generator therein. The control circuit is configured to detect an error(s) in configuration data that is used by the programmable clock driver circuit. This configuration data is read from the nonvolatile memory and stored in volatile program registers during program restore operations. The control circuit is further configured to automatically idle the clock generator in response to detecting the error in the configuration data. This automatic idling of the clock generator may include operations to set the clock generator at a default setting (e.g., minimum frequency), which applies to all output banks of the driver circuit.

20 Claims, 12 Drawing Sheets

U.S. PATENT DOCUMENTS

| | | | |
|---|---|---|---|
| 6,384,653 B1 | 5/2002 | Broome | 327/247 |
| 6,388,478 B1 | 5/2002 | Mann | 327/113 |
| 6,433,645 B1 | 8/2002 | Mann et al. | 331/18 |
| 6,466,098 B2 | 10/2002 | Pickering | 331/25 |
| 6,492,852 B2 * | 12/2002 | Fiscus | 327/158 |
| 6,509,773 B2 | 1/2003 | Buchwald et al. | 327/248 |
| 6,525,584 B2 | 2/2003 | Seo et al. | 327/276 |
| 6,539,072 B1 | 3/2003 | Donnelly et al. | 375/371 |
| 6,597,212 B1 | 7/2003 | Wang et al. | 327/117 |
| 6,678,832 B1 * | 1/2004 | Gotanda | 713/400 |
| 6,691,215 B1 * | 2/2004 | Mirov et al. | 711/167 |
| 6,768,358 B2 * | 7/2004 | Birk et al. | 327/156 |
| 2005/0242853 A1 * | 11/2005 | Kwack et al. | 327/156 |

OTHER PUBLICATIONS

"High-Speed Multi-Phase PLL Clock Buffer," Cypress Semiconductor Corporation, Revised Jul. 25, 2003, 14 pages.

IT Clock Management Products Family, Aug. 2002, Admitted Prior Art, 4 pages, not available.

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496, not ava.

Cypress Semiconductor Corporation, "High Speed Multi-Phase PLL Clock Buffer," RoboClockII™ CY7B994V, CY7B993V, Aug. 8, 2000, 14 pages, not ava.

* cited by examiner

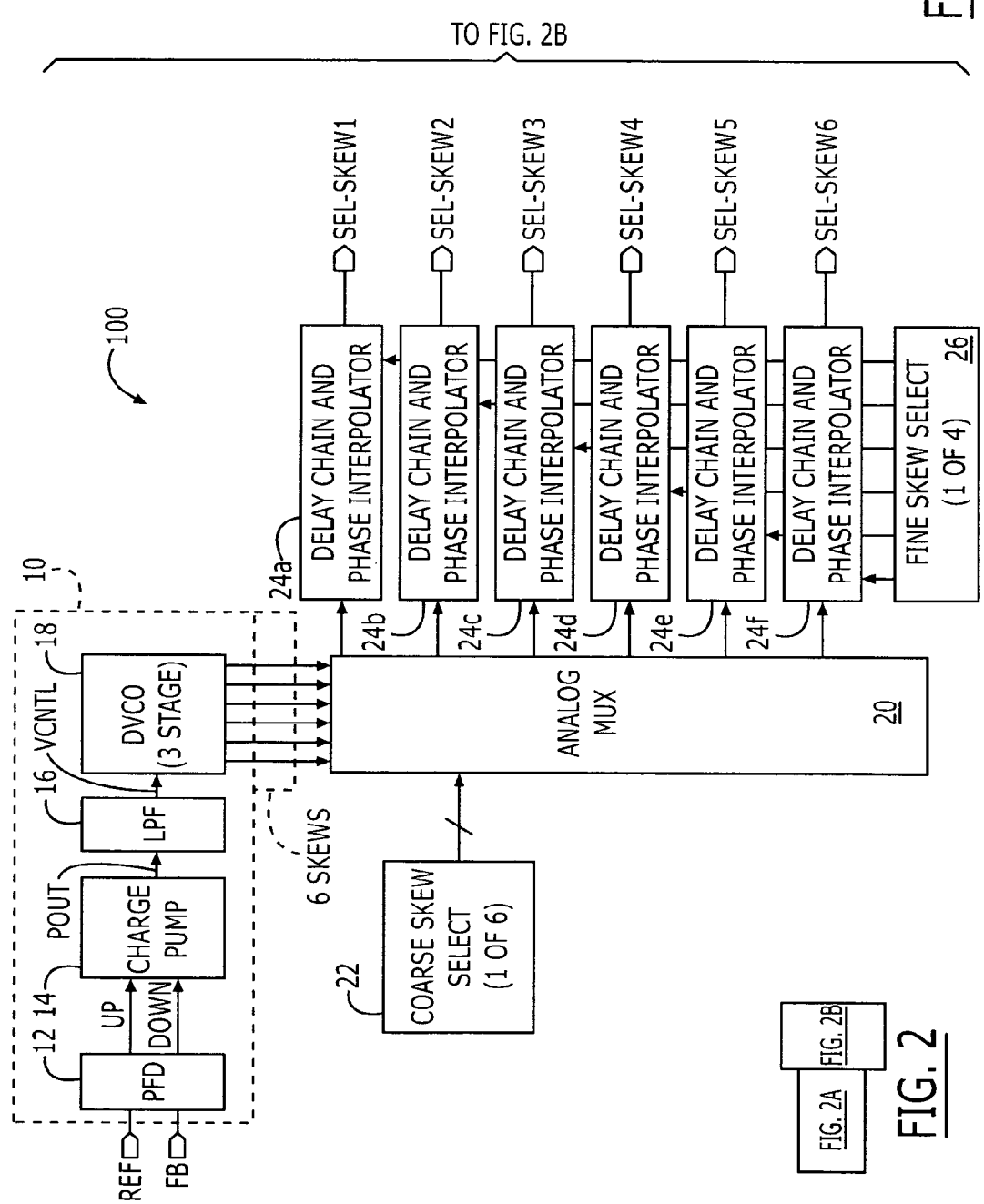

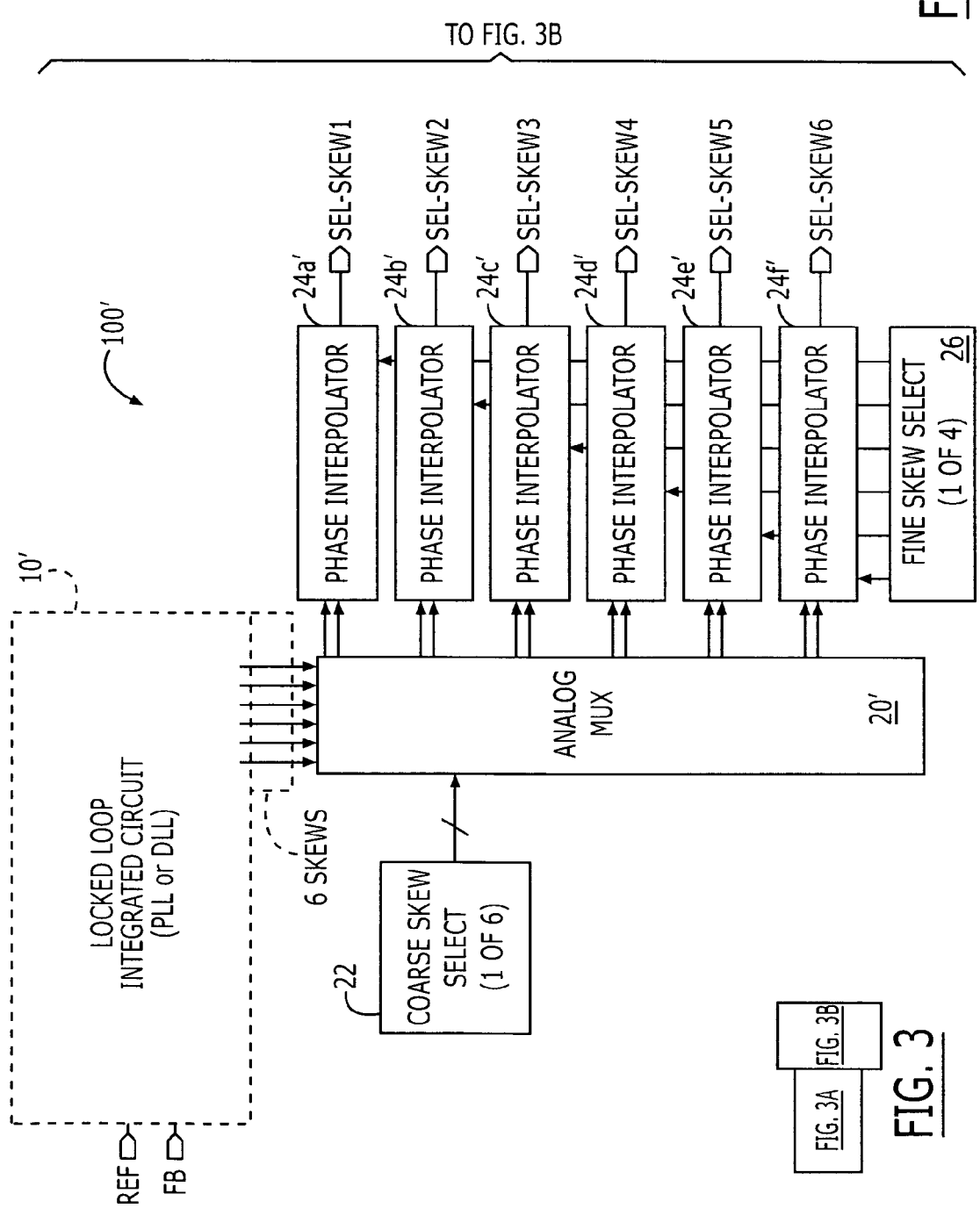

PROGRAMMABLE CLOCK DRIVERS THAT SUPPORT CRC ERROR CHECKING OF CONFIGURATION DATA DURING PROGRAM RESTORE OPERATIONS

REFERENCE TO PRIORITY APPLICATION

This application is a continuation-in-part of U.S. application Ser. No. 10/648,090, filed Aug. 26, 2003 now U.S. Pat. No. 6,977,539, and claims priority to U.S. Provisional Application Ser. No. 60/551,095, filed Mar. 8, 2004, the disclosures of which are hereby incorporated herein by reference.

FIELD OF THE INVENTION

The present invention relates to integrated circuit devices and, more particularly, to integrated circuit devices having clock generators therein and methods of generating clock signals.

BACKGROUND OF THE INVENTION

Phase-locked loop (PLL) and delay-locked loop (DLL) integrated circuits are frequently used to generate highly accurate internal clock signals on integrated circuit substrates (e.g., chips). In some cases, such PLL and DLL integrated circuits may be used in multi-output clock drivers, which may provide clock distribution to a system integrator in order to optimize the timing of high-performance computer and communication systems. One conventional PLL-based clock buffer that provides only limited phase adjustments is the RoboClock™ CY7B994V, which is manufactured by Cypress Semiconductor Corp. This clock buffer is described more fully in Cypress' publicly available datasheet (Doc. No. 38-07127), which may be obtained at Cypress' website.

Unfortunately, such clock buffers may provide only partial-period clock skew control to those clock signal outputs having frequencies equal to divide-by-two or lower (i.e., divide-by-N (Div/N), where N is a positive integer greater than one), relative to an on-chip divide-by-one synchronizing clock signal. As illustrated by the timing diagram of FIG. 1, when only partial-period skew control is provided, clock signal outputs that have been set to frequencies equal to Div/2, Div/3, . . . , Div/6, Div/8, Div/10 or Div/12, for example, may only be provided with skew control that extends over 50% or less of their respective clock periods. Thus, notwithstanding these conventional clock buffers that provide some limited degree of phase adjustments, there continues to be a need for clock buffers having greater functionality and suitability for system environments requiring greater skew control.

SUMMARY OF THE INVENTION

Clock signal generators according to the present invention support generation of clock signals with full-period programmable skew characteristic. According to a first embodiment of the present invention, an integrated circuit chip is provided with a clock driver therein. This clock driver supports generation of a plurality of output clock signals having different frequencies in a range between 1 and 1/N times a frequency of an internal clock signal, where N is a positive integer greater than one. These output clock signals also have full-period programmable skew characteristics.

The internal clock signal is generated by an internal clock signal generator, which may be a locked loop integrated circuit. The locked loop integrated circuit may be a phase-locked loop (PLL) integrated circuit having a voltage-controlled oscillator (VCO) therein. This voltage controlled oscillator may be programmably set to operate at a frequency within a frequency range (e.g., 200 MHz–800 MHz) that is supported by the clock driver. Alternatively, the locked loop integrated circuit may be a delay-locked loop (DLL) integrated circuit, which receives an externally generated clock signal that sets the frequency of the internal clock signal.

In particular, the clock driver is configured to support generation of a divide-by-N clock signal having a full-period programmable skew characteristic that is stepped in N×M time units having a duration equal to 1/M times a period of the internal clock signal, where M is a positive integer greater than eight. In some embodiments, M=C×F, where C and F are positive integers, which represent a number of coarse time units (ctu) of skew adjustment and fine time units (ftu) within each coarse time unit, respectively. To achieve a sufficient degree of skew control, the values of C and F may equal six (6) and four (4), respectively. Thus, a divide-by-8 clock signal may be set to one of 192 skew values (192=8×6×4), which span a full period. In other embodiments, the internal clock signal generator comprises a differential voltage-controlled oscillator (DVCO) having at least ½C stages therein.

These embodiments further include circuitry that enables full-period clock skew control in a preferred manner. This circuitry includes a divide-by-N clock generator that is responsive to a first skew signal (which may be selected in response to coarse and fine skew select signals) and a synchronization unit. The synchronization unit is electrically coupled to an output of the divide-by-N clock generator and is responsive to the first skew signal. The divide-by-N clock generator is configured to generate N separate divide-by-N clock signals that have the same frequency but are phase shifted relative to each other in equal phase increments. A one-of-N select circuit is also provided within the divide-by-N clock generator. This select circuit is configured to select one of the N divide-by-N clock signals in response to a time unit position signal. The synchronization unit is configured to synchronize the selected divide-by-N clock signal to the first skew signal.

The clock driver may also include a delay chain and phase interpolator circuit that is configured to generate the first skew signal in response to a fine skew select signal. This delay chain and phase interpolator circuit is electrically coupled to an output of a multiplexer, which may be configured to receive a plurality of skew signals from the voltage-controlled oscillator within a PLL. The multiplexer may also be responsive to a coarse skew select signal.

According to other embodiments of the present invention, the clock driver includes a locked loop integrated circuit that is configured to generate a plurality of internal clock signals that are skewed in time relative to each but have the same first frequency (e.g., VCO frequency). A skew signal select circuit is also provided. This skew signal select circuit is configured to generate a selected skew signal from at least one of the plurality of internal clock signals. A divide-by-N clock generator is also provided, which is responsive to the selected skew signal. This divide-by-N clock generator is configured to generate a plurality of divide-by-N clock signals that have the same frequency but are phase shifted relative to each other in increments of 360°/N, where N is a positive integer greater than one. This divide-by-N clock generator includes a one-of-N select circuit that is configured to select one of the plurality of divide-by-N clock signals, in response to a time unit position signal. A synchronization unit is electrically coupled to an output of the one-of-N select circuit. This synchronization unit is configured to synchronize a selected one of the plurality of divide-by-N clock signals to the selected skew signal. The synchronized signal is then passed to an output buffer. The output buffer is provided to drive an off-chip load with a divide-by-N output clock signal having a full-period programmable skew characteristic, in response to a synchronized divide-by-N clock signal that is derived directly or indirectly from the synchronization unit.

In some of these embodiments, the skew signal select circuit includes a multiplexer that is configured to receive the plurality of internal clock signals and a "fine" delay chain and phase interpolator circuit that is electrically coupled to an output of the multiplexer. Alternatively, the skew signal select circuit may include a multiplexer that is configured to receive the plurality of internal clock signals and a phase interpolator circuit that is electrically coupled to a pair of outputs of the multiplexer. In this latter case, the skew signal select circuit may not require the use of a "fine" delay chain.

Further embodiments of the present invention include methods of generating a clock signal having a full-period programmable skew characteristic, by generating a plurality of internal clock signals that have equivalent frequencies, but are phase shifted relative to each other in equal time increments. At least one of the plurality of internal clock signals is then selected, in response to a coarse skew select signal. A selected skew signal is then generated from the at least one selected plurality of internal clock signals. A plurality of divide-by-N clock signals are generated in response to the selected skew signal. The plurality of divide-by-N clock signals, which are of equal frequency, are phase shifted relative to each other in increments of 360°/N, where N is a positive integer greater than one. One of these plurality of divide-by-N clock signals is selected in response to a time unit position signal. The selected divide-by-N clock signal is then synchronized to the selected skew signal. In still further embodiments, a pair of differential divide-by-N output clock signals are generated from the synchronized divide-by-N clock signal.

Still further embodiments of the present invention include a packaged integrated circuit device having a nonvolatile memory device and a programmable clock driver circuit therein. The nonvolatile memory device may be provided as an electrically erasable programmable read-only memory (EEPROM) device that is disposed on a first integrated circuit substrate (e.g., semiconductor chip) and the programmable clock driver circuit may be disposed on a second integrated circuit substrate. The first and second integrated circuit substrates may be packaged side-by-side in an integrated circuit package. In alternative embodiments, the nonvolatile memory device and programmable clock driver circuit may be provided as side-by-side circuits on a single integrated circuit chip.

The programmable clock driver circuit includes a control circuit and at least one clock generator therein. According to preferred aspects of these embodiments, the control circuit is configured to detect an error(s) in configuration data that is used by the programmable clock driver circuit. This configuration data is read from the nonvolatile memory and stored in volatile program registers during program restore operations. The control circuit is further configured to automatically idle the at least one clock generator in response to detecting the error in the configuration data. This automatic idling of the clock generator prevents the clock generator from becoming configured in a manner that could potentially damage or alter the performance of downstream devices receiving clock signals generated by the programmable clock driver circuit. This automatic idling may include operations to set the clock generator at a default setting (e.g., minimum frequency), which applies to all output banks of the driver circuit. In alternative embodiments, a detection of an error may result in a "local" disabling of only a single output bank to which the error in the configuration data applies. The clock generator typically includes a phase-locked loop (PLL) integrated circuit that synchronizes the timing of the clock signals generated at the output banks.

The control circuit performs the error detection operations by reading the configuration data from the volatile program registers and generating a first error check word from the configuration data. These operations are performed in response to a program save command (ProgSave) issued to the integrated circuit device. This first error check word may be generated using a cyclic redundancy check (CRC) algorithm to generate a binary number. The control circuit completes the operations associated with the program save command by programming the nonvolatile memory with the configuration data and the first error check word. Thereafter, in response to a program restore command (ProgRestore) issued to the driver circuit, the control circuit reads the configuration data and the first error check word from the nonvolatile memory device and also generates a second error check word from this configuration data. This second error check word is then compared against the first error check word to determine whether a difference exists. The existence of a difference indicates that an error is present in the configuration data that has been read from the nonvolatile memory device.

In some cases, the program restore command may result in a writing of erroneous data into the volatile program registers, however, this erroneous data will be blocked from influencing performance of the programmable clock driver circuit. Instead, the detection of an error in the configuration data will automatically cause the driver circuit to be held in a default mode of operation that precludes generation of an active lock signal at an output pin of the packaged device. This default mode of operation may include holding the PLL integrated circuit at a minimum clock frequency and precluding phase lock by the PLL integrated circuit. Precluding phase lock may operate to inform another "master" device that the driver circuit (e.g., "slave" device) needs to be reprogrammed to correct the detected error. Such reprogramming operations may be performed in response to issuance of a program write command and new configuration data by the master device. Alternatively, the master device may issue a program restore command to the driver circuit, which causes another internal downloading of the configuration data from the nonvolatile memory to the volatile registers. Still further operations performed by the control circuit may include automatically performing error correction operations on the configuration data once an error has been detected during a program restore operation. In such cases, the error check word may be generated using a Hamming code that supports at least single bit error correction.

DETAILED DESCRIPTION OF PREFERRED EMBODIMENTS

Figure 1:
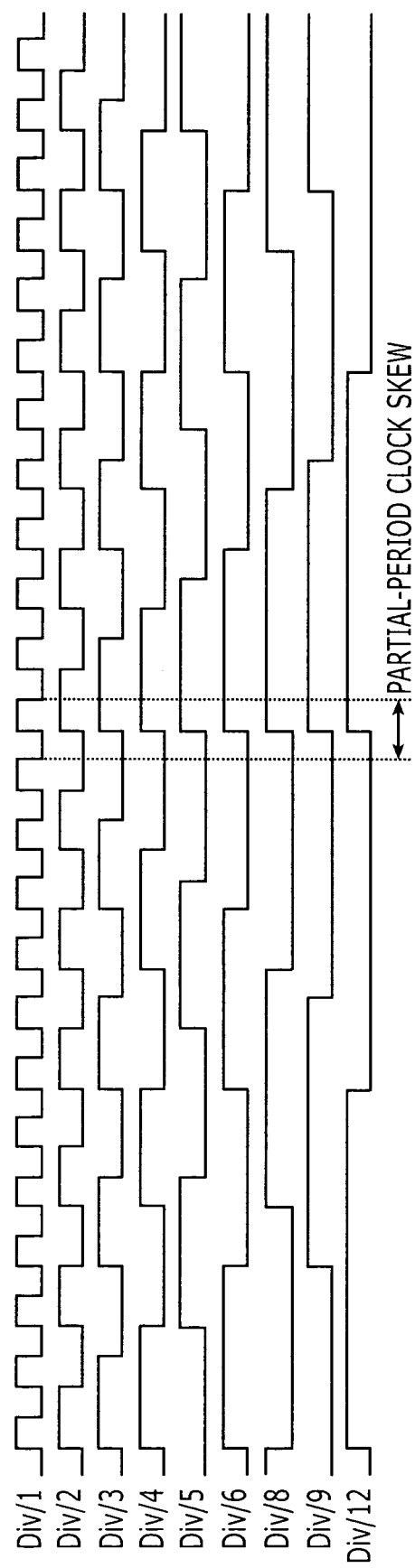
FIG. 1 is a timing diagram that illustrates a plurality of divide-by-N clock signals that are edge aligned.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Referring now to FIG. 2A, a clock driver 100 according to a first embodiment of the present invention will be described. This clock driver 100 includes an internal clock signal generator that is configured to generate a plurality of phase-shifted clock signals on an integrated circuit chip. An exemplary internal clock signal generator is illustrated as a phase-locked loop (PLL) integrated circuit 10 and the plurality of phase-shifted clock signals are illustrated as six "skew" signals, which are phase-shifted relative to each other in increments of 360°/6. A greater or fewer number of skew signals may also be provided in other clock driver embodiments. The PLL integrated circuit 10 is illustrated as including a phase-frequency detector (PFD) 12, a charge pump 14, a loop filter 16 (e.g., low-pass filter) and a voltage controlled oscillator (VCO) 18, which is shown as a differential VCO (DVCO) having three stages. The PFD 12 may be configured to generate UP and DOWN control signals in response to a reference clock signal (REF) and a feedback clock signal (FB). In particular, the PFD 12 may be configured to compare the phases of the reference and feedback clock signals and generate an active UP signal or an active DOWN signal when the feedback clock signal FB lags or leads the reference clock signal REF. As will be understood by those skilled in the art, the reference clock signal REF may be a buffered version of an external clock signal (not shown) that is received by an integrated circuit chip. The charge pump 14 may be operative to convert the digitally encoded UP and DOWN control signals into an analog pump output signal (POUT) that sources current to or sinks current from the loop filter 16. The loop filter 16 is illustrated as generating an analog control voltage (VCNTL), which is provided as an input to the VCO 18. An active UP signal may operate to increase the value of the control voltage, which speeds up the VCO 18 and causes the feedback clock signal FB to catch up with the reference clock signal REF. On the other hand, an active DOWN signal may slow down the VCO 18 and eliminate the phase lead of the feedback clock signal FB. These and other aspects of conventional PLL circuits are more fully illustrated and described at section 9.5.2 of a textbook by Jan M. Rabaey, entitled Digital Integrated Circuits: A Design Perspective, Prentice-Hall, ISBN 0-13-178609-1, pp. 540–542.

The VCO 18 is illustrated as having a plurality of differential stages, which are each responsible for generating a pair of skew signals. Each pair of skew signals includes a true skew signal and a complementary skew signal, which is 180° out-of-phase relative to the corresponding true skew signal. Thus, three pairs of differential skew signals result in six skew signals (6 SKEWS) that are "coarsely" separated from each other by 60°. As illustrated, these skew signals are provided to a skew signal select circuit, which is configured to generate a plurality of selected skew signals (SEL-SKEW1 to SEL-SKEW6). The skew signal select circuit is illustrated as including an analog multiplexer 20, a coarse skew select circuit 22, a fine skew select circuit 26 and a plurality of delay chain and phase interpolator circuits 24a–24f. Other embodiments of a skew signal select circuit are also possible.

The coarse and fine skew select circuits 22 and 26 may have programmable features that support field programming of the clock driver 100 by an end user. For example, non-volatile memory (not shown) may be provided within a packaged clock driver chip to support automatic updating of skew configuration data during each power-down/up or other reset event. The coarse skew select circuit 22 is configured to generate a plurality of coarse skew select signals, which are received by the multiplexer 20. In response to the coarse skew select signals, the multiplexer 20 routes one or more of the skew signals to a plurality of outputs of the multiplexer 20. In some applications, a single "coarsely" selected skew signal may be routed (i.e., broadcast) to a plurality of outputs of the multiplexer 20.

Figure 4A:
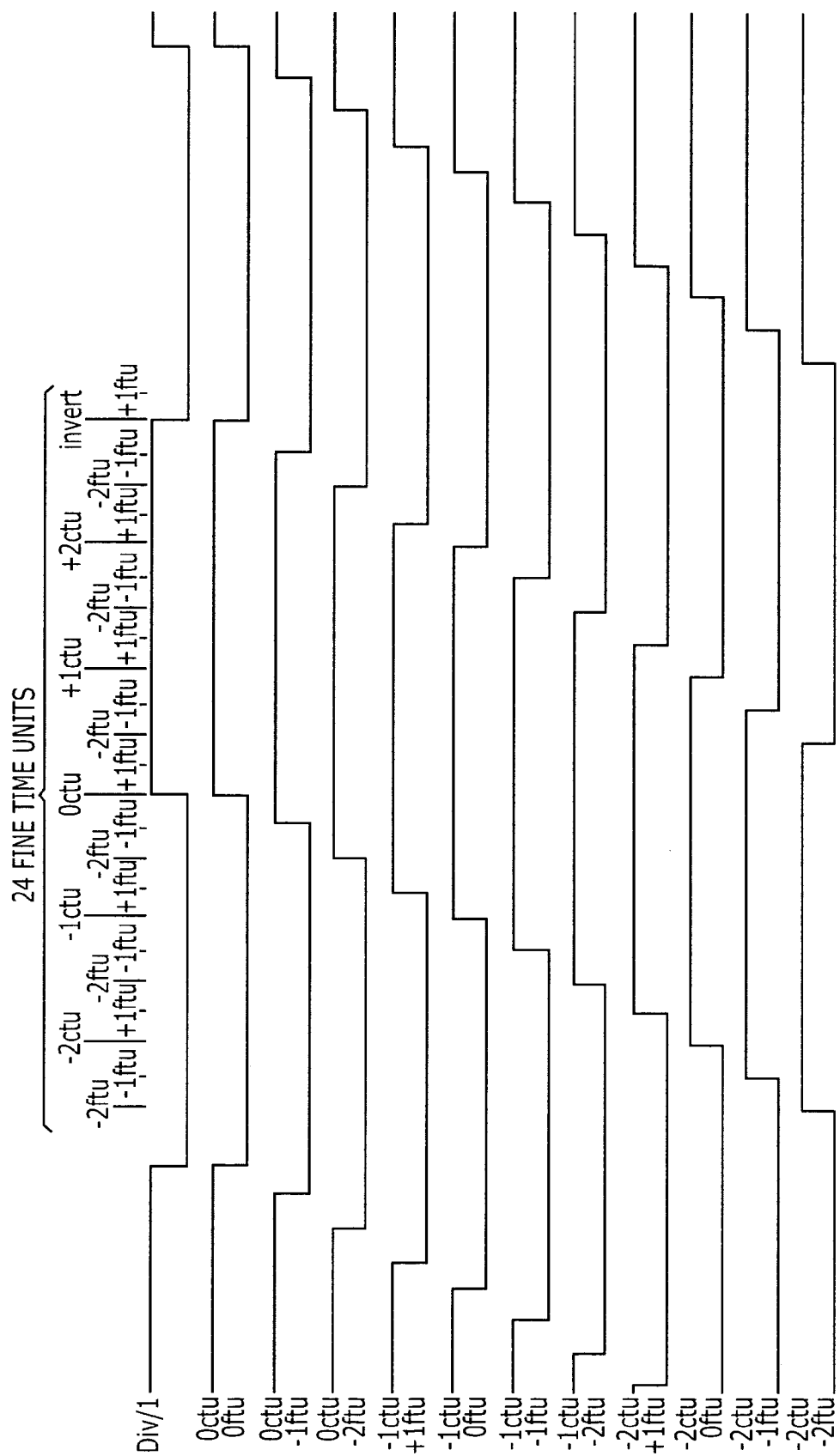
FIG. 4A is a timing diagram that illustrates the range of a full-period of programmable skews that apply to a divide-by-N clock signal, where N=1 and the coarse time range is from −((3×N)−1) to +((3×N)−1) & INVERT.

Each of the coarsely selected skew signals is provided to one or more of the delay chain and phase interpolator circuits 24a–24f. The delay chain and phase interpolator circuits 24a–24f are responsive to respective fine skew select signals, which are generated by the fine skew select circuit 26. The delay chain and phase interpolator circuits may be of conventional design and need not be described further herein. In the illustrated embodiment, four time units of fine skew control are provided by each of the delay chain and phase interpolator circuits 24a–24f and six time units of coarse skew control are provided by the coarse skew select circuit 22 and multiplexer 20. Accordingly, each of the selected skew signals SEL-SKEW1 to SEL-SKEW6 may be skewed in fine time increments of Tvco/24, where Tvco represents the period of the voltage-controlled oscillator 18. These increments are more fully illustrated by FIG. 4A, which is a timing diagram that illustrates the range of a full-period of programmable skews that apply to a divide-by-one selected skew signal (e.g., SEL-SKEWn, where n=1 to 6). In FIG. 4A, the coarse time range is from $-((3 \times N)-1)$ to $+((3 \times N)-1)$ & INVERT, where N=1. The signal Div/1 has the same timing as the signal that has been shifted in time by zero coarse time units and zero fine time units, which is shown as: ($0ctu$, $0ftu$). The signal ($0ctu,-1ftu$) represents a selected skew signal that leads the signal Div/1 by one fine time unit. Similarly, the signal ($-2ctu$, $-2ftu$) leads the signal Div/1 by ten time units. Selected skew signals having positive ctu values are also possible, as described more fully hereinbelow.

Figure 5:
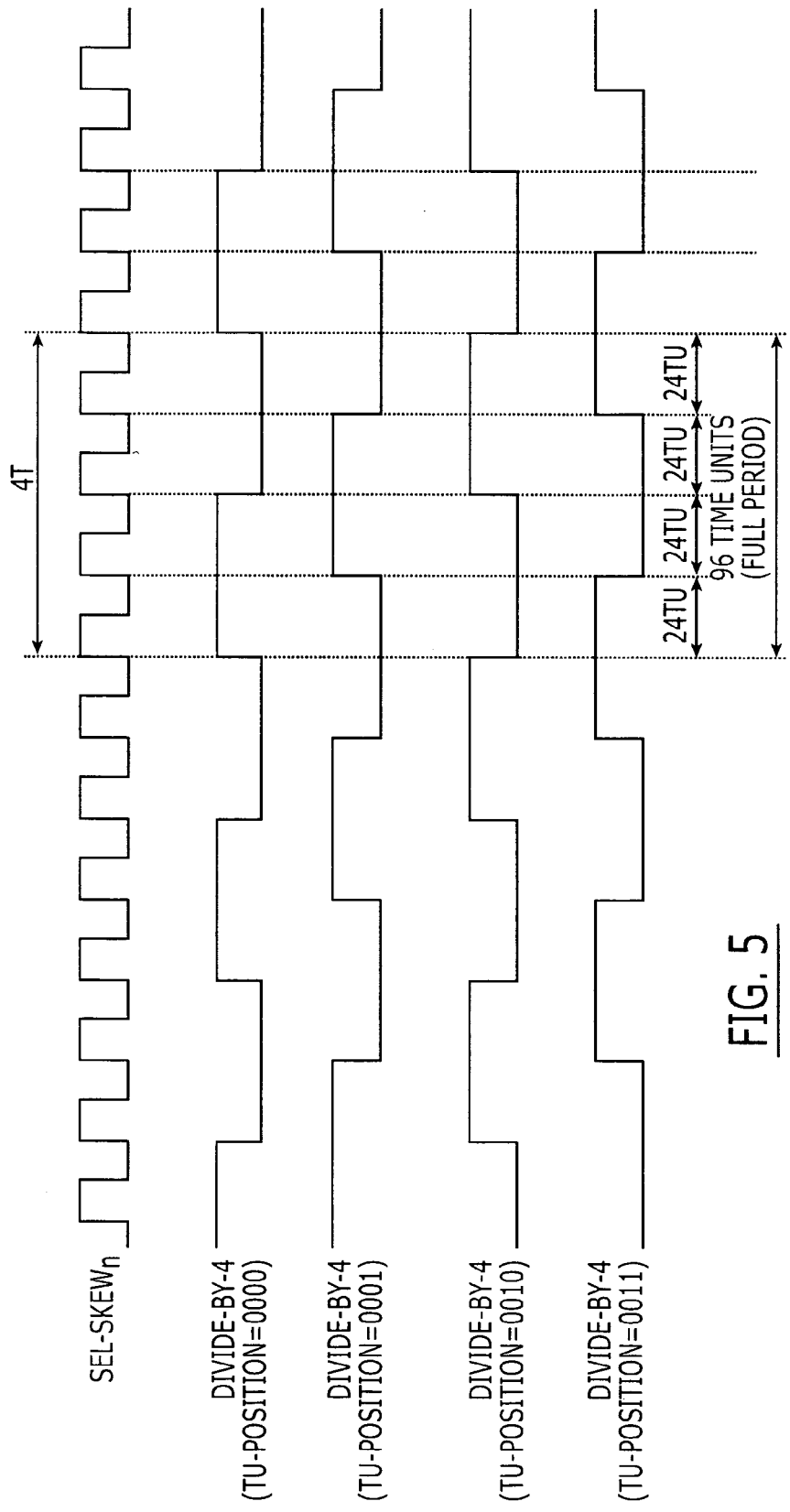
FIG. 5 is a timing diagram that illustrates a plurality of divide-by-4 clock signals that are phase-shifted by 90° relative to each other, with each signal possessing a T/4 (one-quarter period) skew characteristic.

TU-POSITIONn is freely programmable over the N possible values, a programmable full period skew characteristic can be achieved at the output of each divide-by-N clock generator 30a–30f. In FIG. 5, this full-period skew characteristic is illustrated as ranging over 96 time units for the case where N=4 and 96=4×24.

This full period skew characteristic is more fully illustrated by TABLE 1, where the voltage-controlled oscillator (VCO) frequency is illustrated as ranging from 200 MHz to 800 MHz and the frequency of clock signals generated at outputs of the clock driver 100 are illustrated as ranging from 16.67 MHz to 800 MHz. The duration of each coarse time unit (ctu) equals one-sixth the period of the voltage-controlled oscillator and the duration of each fine time unit (ftu) equals one-fourth the duration of the coarse time unit. Thus, in the illustrated embodiment, the total number of fine time units across a full period of skew control equals 24×N. Other embodiments having a different number of time units across a full period are also possible.

TABLE 1

| FREQUENCY VCO (MHz) | OUTPUT FREQUENCY (MHz) | PERIOD = Tout (ns) | COARSE TIME UNIT DURATION (ps) (CTU = Tvco/6) | FINE TIME UNIT DURATION (ps) (FTU = CTU/4) | NUMBER OF TIME UNITS | FULL PERIOD SKEW CONTROL |
|---|---|---|---|---|---|---|
| 800 | 800 | 1.25 | 208 | 52 | 24 | 24 × 52 ps = 1.25 ns |
| 600 | 600 | 1.66 | 277 | 69.25 | 24 | 24 × 69.25 ps = 1.66 ns |
| 400 | 400 | 2.5 | 416 | 104 | 24 | 24 × 104 ps = 2.5 ns |
| 200 | 200 | 5 | 833 | 208 | 24 | 24 × 208 ps = 5 ns |
| 200 | 50 (div 4) | 20 | 833 | 208 | 24 × 4 = 96 | 96 × 208 ps = 20 ns |
| 400 | 50 (div 8) | 20 | 416 | 104 | 24 × 8 = 192 | 192 × 104 ps = 20 ns |
| 800 | 66.67 (div 12) | 15 | 208 | 52 | 24 × 12 = 288 | 288 × 52 ps = 15 ns |
| 200 | 16.67 (div 12) | 60 | 833 | 208 | 24 × 12 = 288 | 288 × 208 ps = 60 ns |

Figure 2B:
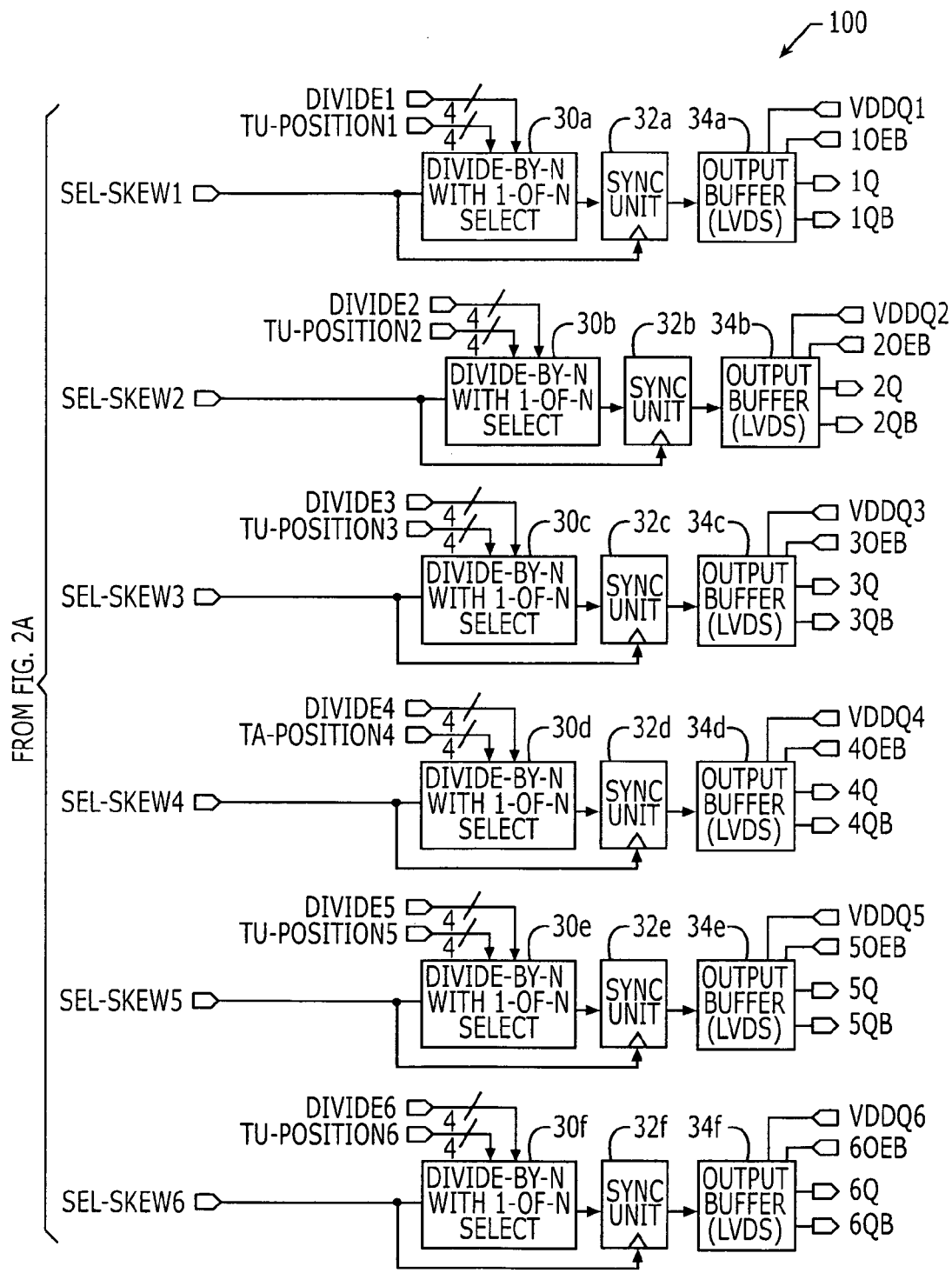
FIG. 2 is a block diagram of a PLL-based clock driver according to an embodiment of the present invention.

The selected skew signals of FIG. 2A are provided as inputs to the divide-by-N clock generators 30a–30f of FIG. 2B. These clock generators 30a–30f are responsive to a plurality of multi-bit control signals, which are shown as the divide signals DIVIDEn and the time unit position signals TU-POSITIONn, where n=1 to 6 in the illustrated embodiment. Each of the divide-by-N clock generators 30a–30f includes a corresponding divide-by-N clock generator circuit and a 1-of-N select circuit. The divide-by-N clock generator circuit is configured to generate N phase-shifted divide-by-N clock signals, with the value N being set by the corresponding divide signal DIVIDEn. The 1-of-N select circuit is configured to select one of the N phase-shifted divide-by-N clock signals.

As illustrated by the timing diagram of FIG. 5, if N=4, then four divide-by-4 clock signals will be generated by the divide-by-N clock generator circuit. Each of the four divide-by-4 clock signals will retain the corresponding skew characteristics that is represented in the selected skew signal provided by the skew signal select circuit of FIG. 2A. The four divide-by-4 clock signals will be phase-shifted in increments of 90°, where 90°=360°/4. The value of the time unit position signal TU-POSITIONn determines which one of the N phase-shifted divide-by-N clock signals will be provided to the corresponding synchronization unit 32a–32f.

Figure 4B:
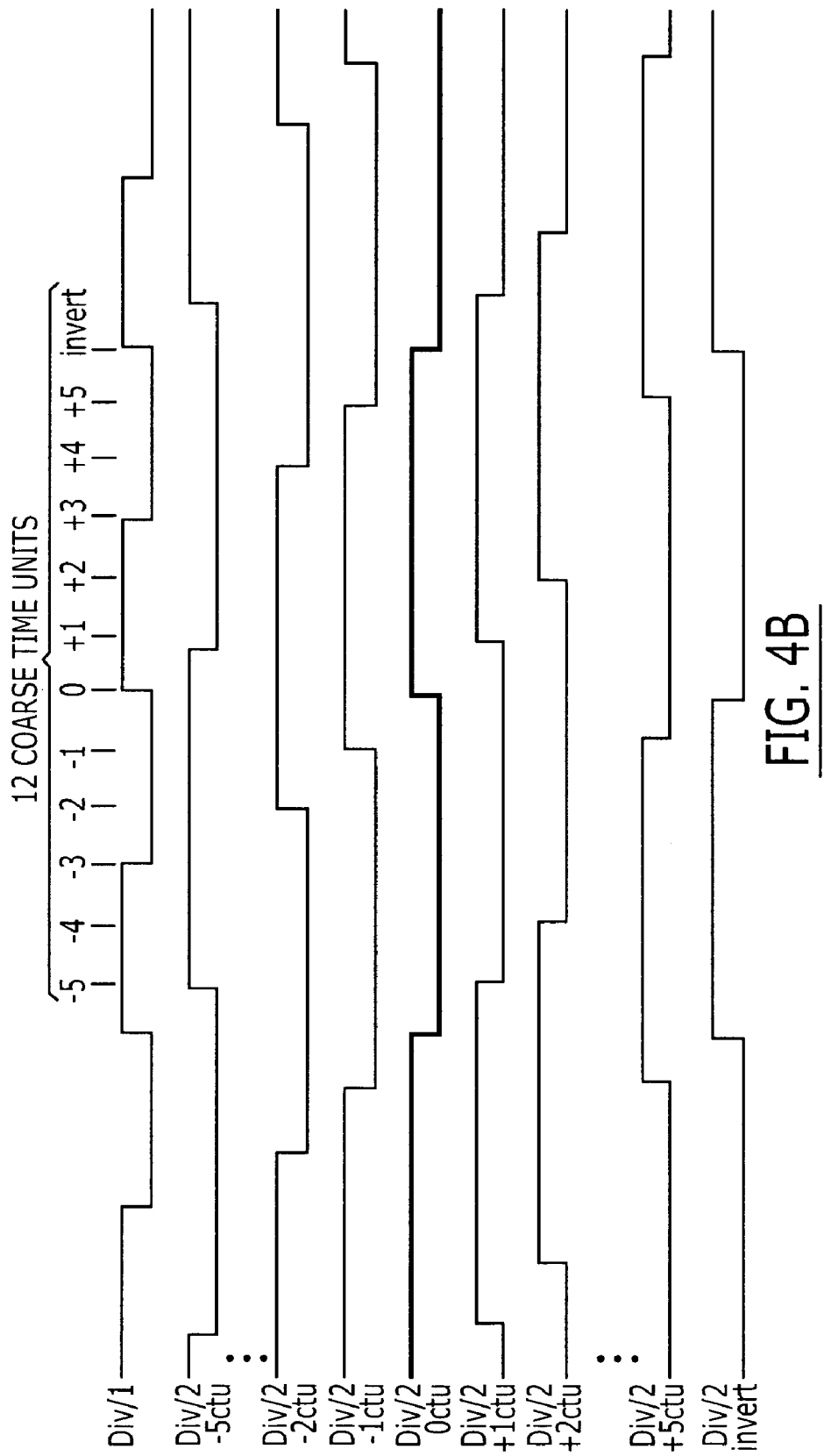
FIG. 4B is a timing diagram that illustrates the range of a full-period of programmable skews that apply to a divide-by-N clock signal, where N=2 and the coarse time range is from −((3×N)−1) to +((3×N)−1) & INVERT.
Figure 4C:
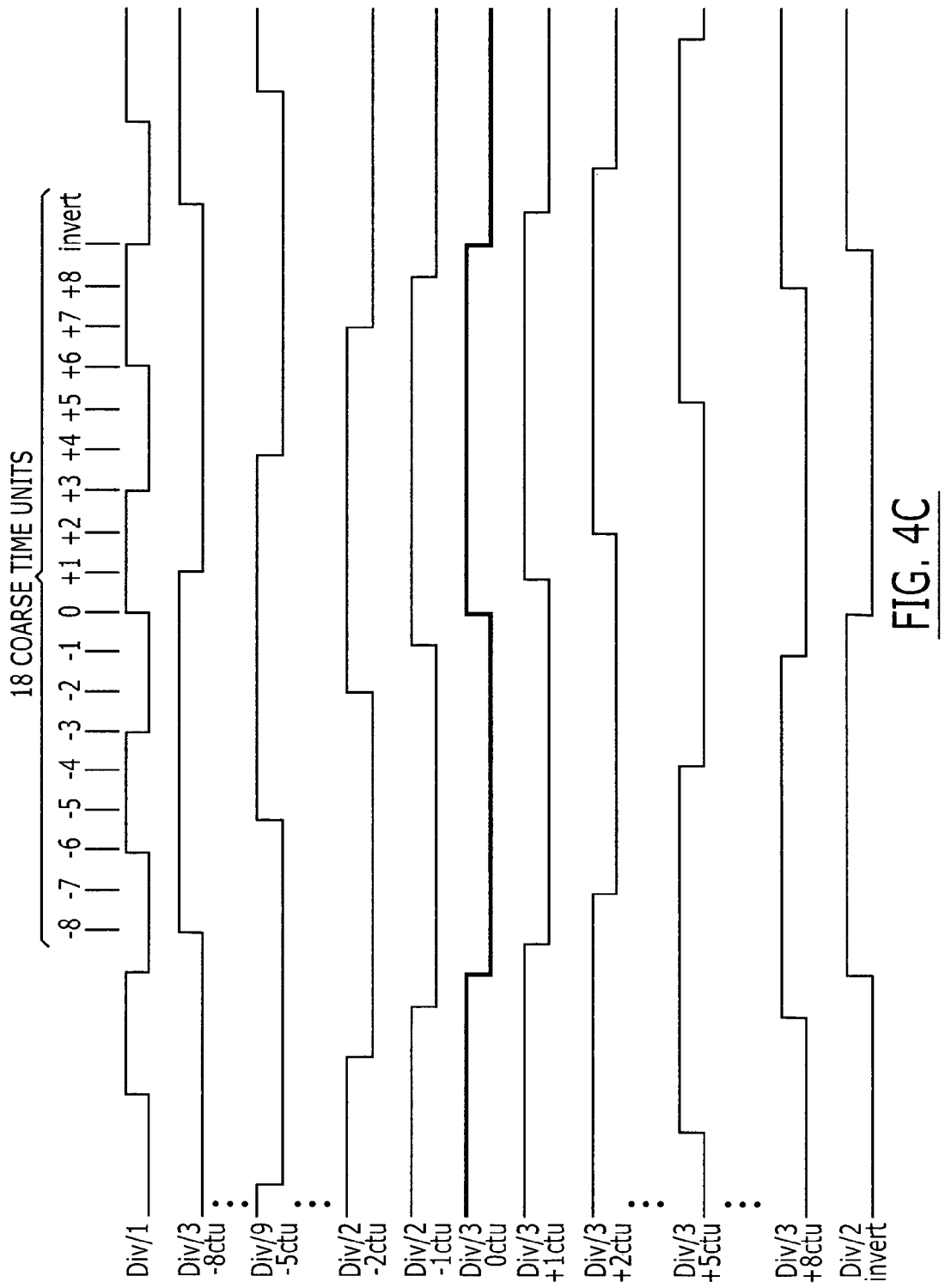
FIG. 4C is a timing diagram that illustrates the range of a full-period of programmable skews that apply to a divide-by-N clock signal, where N=3 and the coarse time range is from −((3×N)−1) to +((3×N)−1) & INVERT.

Accordingly, the signals generated by the coarse and fine skew select circuits 22 and 26 and the time unit position signal TU-POSITIONn can be programmed to collectively provide a selected divide-by-N clock signal having a desired skew characteristic. Because the time unit position signal The full-period shew characteristics associated with selected divide-by-2 (Div/2) and divide-by-3 (Div/3) clock signals are further illustrated by the timing diagrams of FIGS. 4B–4C, respectively. In particular, FIG. 4B illustrates a coarse time unit range from $-((3 \times 2)-1)$ctu to $+((3 \times 2)-1)$ ctu & INVERT, which includes 12 coarse time units and 12×4=48 fine time units across a full period. The Div/2 clock signal that is highlighted in bold in FIG. 4B represents a clock signal having zero timing skew relative to one of the skew signals (i.e., a reference skew signal) generated by the VCO 18. The Div/2 clock signals that are above the highlighted Div/2 signal have leading skew characteristics and the Div/2 clock signals that are below the highlighted Div/2 signal have lagging skew characteristics. Similarly, FIG. 4C illustrates a coarse time unit range from $-((3 \times 3)-1)$ctu to $+((3 \times 3)-1)$ctu & INVERT, which includes 18 coarse time units and 18×4=72 fine time units across a full period. The Div/3 clock signal that is highlighted in bold in FIG. 4C represents a clock signal having zero timing skew relative to one of the skew signals (i.e., a reference skew signal) generated by the VCO 18. The Div/3 clock signals that are above the highlighted Div/3 signal have leading skew characteristics and the Div/3 clock signals that are below the highlighted Div/3 signal have lagging skew characteristics.

The range of full-period skew characteristics associated with the following clock signals: Div/2, Div/3, Div/4, Div/5, Div/6, Div/8, Div/10 and Div/12, are more fully illustrated by TABLE 2.

TABLE 2

| DIVIDE-BY-N | COARSE TIME UNITS | FINE TIME UNITS | TIME UNIT RANGE $-((3 \times N) - 1)$ ctu to $+((3 \times N) - 1)$ ctu & INVERT |
|---|---|---|---|
| 1 | 6 | 4 | {(−2 ctu, −2 ftu), . . . , (+2 ctu, +1 ftu), (invert, −2 ftu), . . . , (invert, +1 ftu)} = 24 Time Units |
| 2 | 12 = 6 × 2 | 4 | {(−5 ctu, −2 ftu), . . . , (+2 ctu, +1 ftu), (invert, −2 ftu), . . . , (invert, +1 ftu)} = 48 Time Units |
| 3 | 18 = 6 × 3 | 4 | {(−8 ctu, −2 ftu), . . . , (+8 ctu, +1 ftu), (invert, −2 ftu), . . . , (invert, +1 ftu)} = 72 Time Units |
| 4 | 24 = 6 × 4 | 4 | {(−11 ctu, −2 ftu), . . . , (+11 ctu, +1 ftu), (invert, −2 ftu), . . . , (invert, +1 ftu)} = 96 Time Units |
| 5 | 30 = 6 × 5 | 4 | {(−14 ctu, −2 ftu), . . . , (+14 ctu, +1 ftu), (invert, −2 ftu), . . . , (invert, +1 ftu)} = 120 Time Units |
| 6 | 36 = 6 × 6 | 4 | {(−17 tu, −2 ftu), . . . , (+17 ctu, +1 ftu), (invert, −2 ftu), . . . , (invert, +1 ftu)} = 144 Time Units |
| 8 | 48 = 6 × 8 | 4 | {(−23 ctu, −2 ftu), . . . , (+23 ctu, +1 ftu), (invert, −2 ftu), . . . , (invert, +1 ftu)} = 192 Time Units |
| 10 | 60 = 6 × 10 | 4 | {(−29 ctu, −2 ftu), . . . , (+29 ctu, +1 ftu), (invert, −2 ftu), . . . , (invert, +1 ftu)} = 240 Time Units |
| 12 | 72 = 6 × 12 | 4 | {(−35 ctu, −2 ftu), . . . , (+35 ctu, +1 ftu), (invert, −2 ftu), . . . , (invert, +1 ftu)} = 288 Time Units |

Referring again to FIG. 2B, each selected divide-by-N clock signal that is generated by a respective divide-by-N clock generator 30a–30f is passed to a corresponding one of the synchronization units 32a–32f and resynchronized with the timing of the corresponding selected skew signal. After resynchronization, each selected divide-by-N clock signal is passed to a respective one of the plurality of output buffers 34a–34f. These output buffers 34a–34f are illustrated as differential output buffers that drive output pins with complementary clock signals, shown as nQ and nQB, where n=1 to 6. These output buffers 34a–34f may be configured to generate differential clock signals having different voltage swings, as established by the respective power supply lines (shown as VDDQn) provided to each buffer. Active low output enable signals (nOEB) are also provided to each of the output buffers 34a–34f. When an output enable signal nOEB is set high, the differential outputs of a respective output buffer are set to high impedance states. Output buffers of different design may also be used.

Figure 3B:
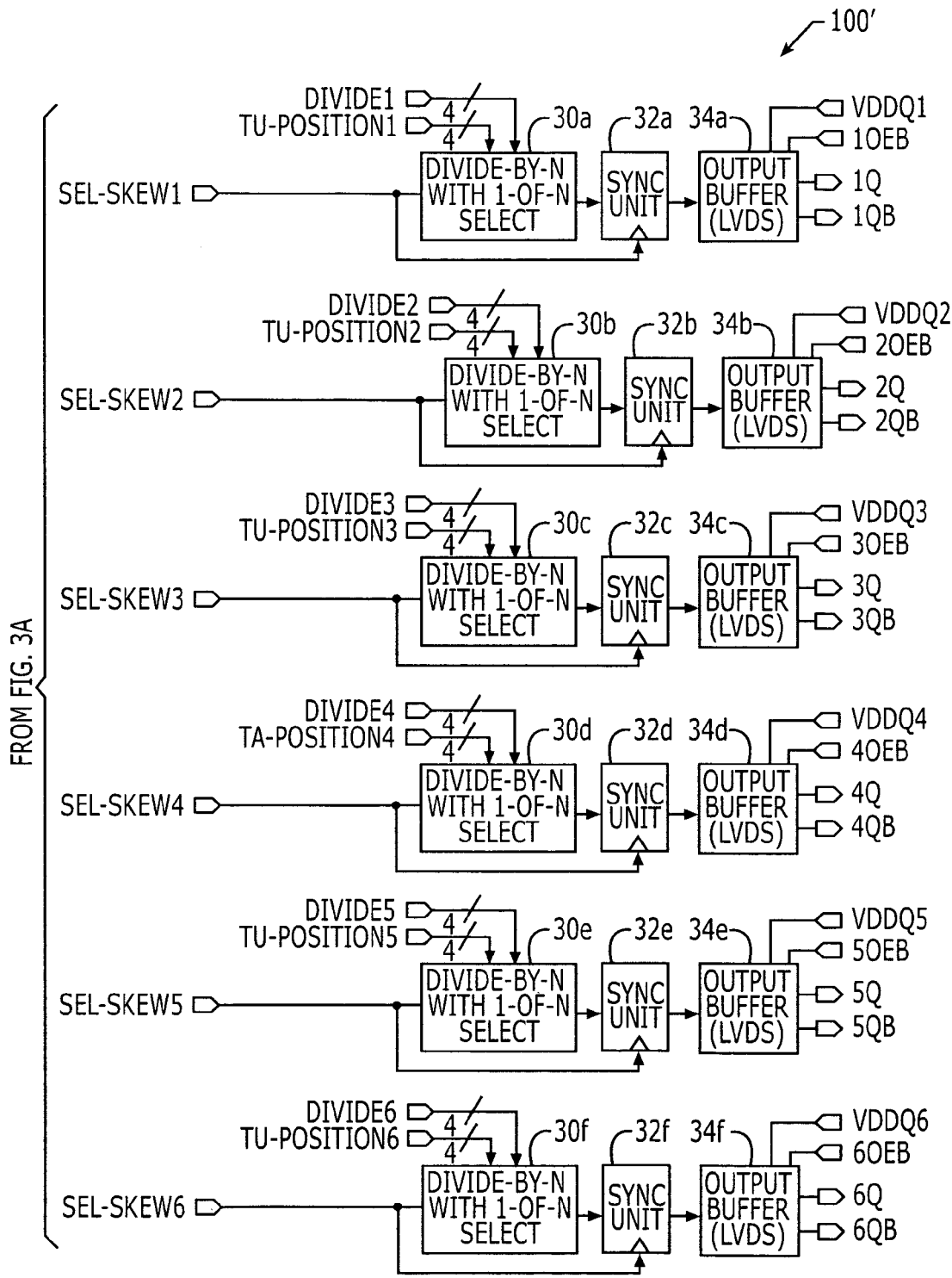
FIG. 3 is a block diagram of a clock driver according to another embodiment of the present invention.

Referring now to FIG. 3, a clock driver 100' according to another embodiment of the present invention will be described. The clock driver 100' of FIG. 3 is similar to the clock driver 100 of FIG. 2, however a more general locked loop integrated circuit 10' is illustrated. This locked loop integrated circuit 10' may be a phase-locked loop (PLL) or a delay-locked loop (DLL) integrated circuit. Moreover, a multiplexer 20' is provided having six pairs of outputs. These six pairs of outputs are provided to corresponding phase interpolator circuits 24a'–24f', which are responsive to corresponding fine skew select signals that are generated by the fine skew select circuit 26. If the six skew signals generated by the locked loop integrated circuit 10' are labeled as SKEW1–SKEW6 according to their consecutive phases, then the pairs of skew signals that could be selected by the coarse skew select circuit 22 would be grouped as follows: (SKEW1, SKEW2), (SKEW2, SKEW3), (SKEW3, SKEW4), (SKEW4, SKEW5), (SKEW5, SKEW6) and (SKEW6, SKEW1). The phase interpolator circuits 24a'–24f' operate to generate a selected skew signal SEL-SKEWn having a fine skew adjustment relative to one of the pairs of skew signals. The other elements illustrated by FIG. 3 are otherwise equivalent to those described above with respect to FIG. 2 and need not be described further herein.

Notwithstanding this disclosure of preferred techniques to generate clock signals having full-period skew characteristics, less preferred clock) drivers may be configured to generate clock signals having less than full-period skew characteristics. For example, the divide-by-N clock generators 30a–30f may be configured to generate only N−1 phase-shifted divide-by-N clock signals for those cases where N is greater than two. Thus, in the event N=12, the divide-by-N clock generator 30a may be configured to generate 11 divide-by-N clock signals so that a corresponding output clock signal having a 0.916 times full-period clock skew may be achieved using a one-of-(N−1) select circuit, for N greater than two. Alternatively, in the event N=3, the divide-by-N clock generator 30a may be configured to generate 2 divide-by-N clock signals so that a corresponding output clock signal having a 0.667 times full-period clock skew may be achieved using the one-of-(N−1) select circuit.

Figure 6A:
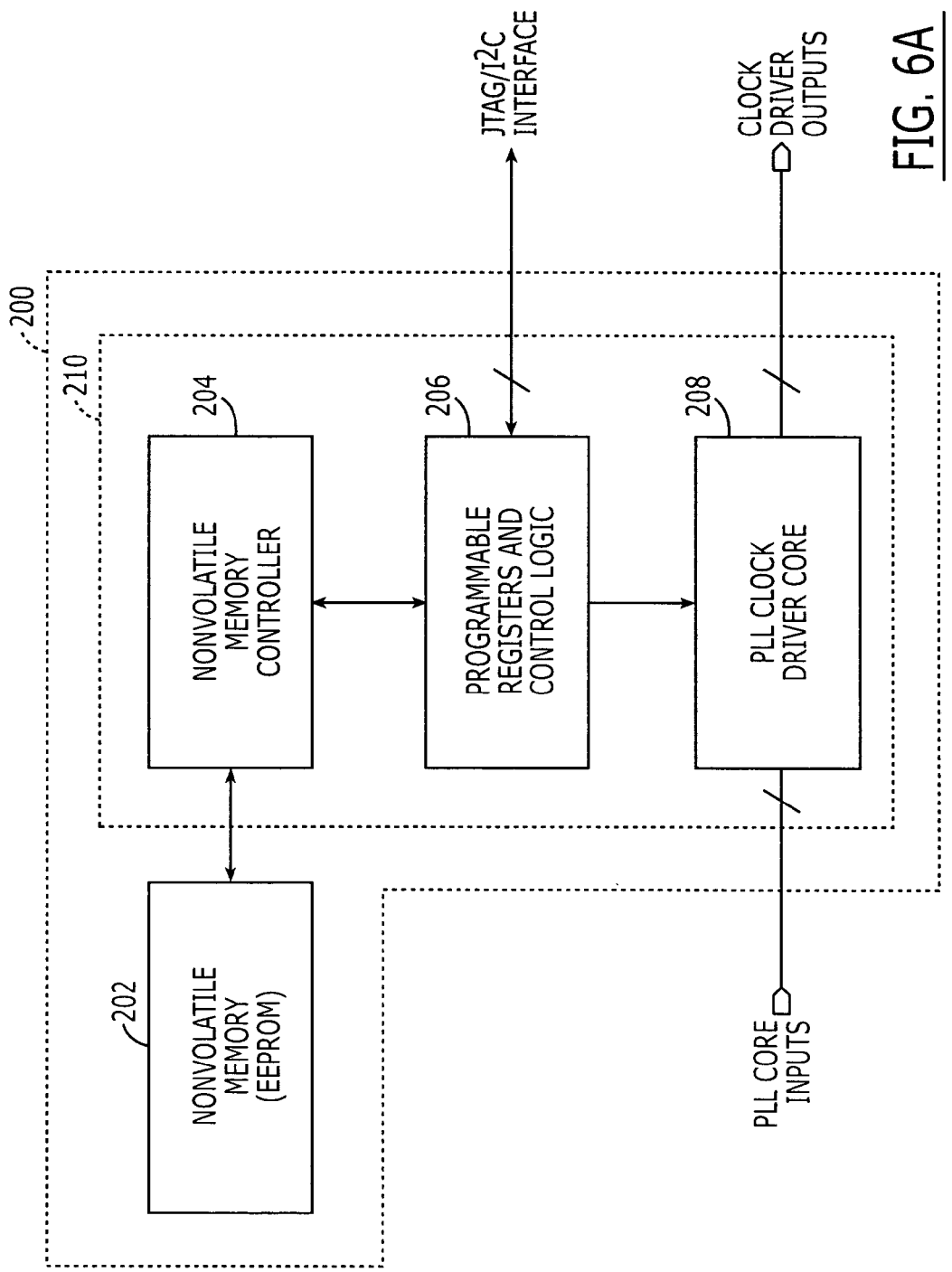
FIG. 6A is a block diagram of a packaged multi-chip programmable clock driver system according to embodiments of the present invention.

Further embodiments of the present invention include packaged clock driver circuits that utilize nonvolatile memory devices to support automatic reprogramming operations during power-up/reset events and enable restoration of a prior configuration profile(s). As illustrated by FIG. 6A, a packaged integrated circuit device 200 is illustrated having a nonvolatile memory device 202 and a programmable clock driver circuit 210 therein. The nonvolatile memory device 202 may be provided as an electrically erasable programmable read-only memory (EEPROM) device that is disposed on a first integrated circuit substrate (e.g., semiconductor chip). The programmable clock driver circuit 210 may be disposed on a second integrated circuit substrate that is electrically coupled (e.g., wired bonded) to the first integrated circuit substrate within a common integrated circuit package. In alternative embodiments, the nonvolatile memory device 202 and the programmable clock driver circuit 210 may be provided as side-by-side circuits on a single integrated circuit chip.

Figure 6B:
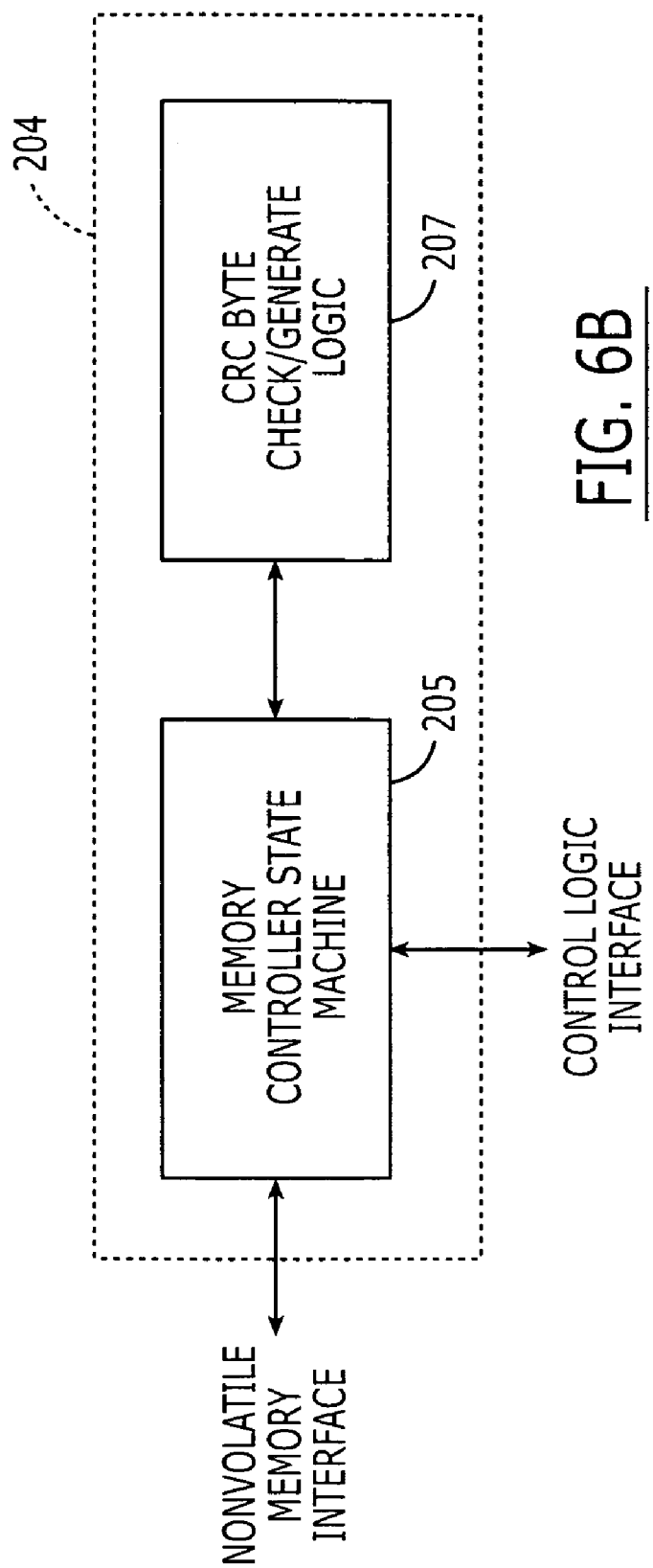
FIG. 6B is a block diagram of a nonvolatile memory controller than may be used in the programmable clock driver system of FIG. 6A.

The programmable clock driver circuit 210 includes a control circuit and at least one clock generator therein. The control circuit is illustrated in FIG. 6A by a pair of blocks. These blocks are shown as the nonvolatile memory controller 204 and the programmable registers and control logic 206. The programmable registers are described herein as volatile registers that retain configuration data for the driver circuit 210. The memory controller 204 is also described herein as including a memory controller state machine 205 and a CRC byte check and byte generator logic 207, as illustrated by FIG. 6B. One embodiment of the clock generator is illustrated as the PLL clock driver core 208 which receives PLL core inputs (e.g., reference and feedback clock signals) and generates multiple banks of clock driver outputs. A preferred configuration of the packaged integrated circuit device 200 is illustrated more fully in an IDT datasheet entitled: "EEPROM Programmable 2.5V Zero Delay PLL Clock Driver," which accompanied the aforementioned U.S. Provisional Application Ser. No. 60/551, 095, filed Mar. 8, 2004, the disclosure of which is hereby incorporated herein by reference.

The control circuit is configured to detect an error(s) in configuration data that is used by the programmable clock driver circuit 210. This configuration data is read from the nonvolatile memory 202 and stored in the volatile program registers 206 during program restore operations. Pages 7–8 of the IDT datasheet illustrate 12 bytes (e.g., 96 bits) of configuration data that may be utilized within a device configured to support six banks of clock driver outputs, including one bank that is responsible for generating a pair of differential feedback clock signals (e.g., QFB,/QFB). The control circuit is further configured to automatically idle the at least one clock generator within the PLL clock driver core 208 in response to detecting the error in the configuration data. This automatic idling of the clock generator prevents the clock generator from becoming configured in a manner that could potentially damage or alter the performance of downstream devices receiving clock signals (i.e., clock driver outputs) generated by the programmable clock driver circuit 210. This automatic idling may include operations to set the clock generator at a default setting (e.g., minimum frequency), which applies to all output banks of the driver core circuit 208. In alternative embodiments, a detection of an error may result in a "local" disabling of only a single output bank to which the error in the configuration data applies. The clock generator typically includes a phase-locked loop (PLL) integrated circuit that synchronizes the timing of the clock signals generated at the output banks.

The control circuit performs error detection operations by reading the configuration data from the volatile program registers into the nonvolatile memory controller 204. In response to this reading operation, a first error check word is generated from the configuration data. This first error check word may constitute a cyclic redundancy check (CRC) byte (e.g., 8 bits) that is generated within the CRC byte check/generate logic 207. These operations may be performed in response to a program save command (ProgSave) issued to the integrated circuit device 200 (see, e.g., page 12 of the IDT attached datasheet). This first error check word may be generated using a cyclic redundancy check (CRC) algorithm that generates a binary number. The control circuit completes the operations associated with the program save command by programming the nonvolatile memory 202 with the configuration data and the first error check word. Thereafter, in response to a program restore command (ProgRestore) issued to the driver circuit 210, the control circuit reads the configuration data and the first error check word from the nonvolatile memory 202 and also generates a second error check word from this configuration data. This second error check word is then compared against the first error check word to determine whether a difference exists. The existence of a difference indicates that an error is present in the configuration data that has been read from the nonvolatile memory device 202.

In some cases, the program restore command may result in a writing of erroneous data into the volatile program registers, however, this erroneous data will be blocked from influencing performance of the programmable clock driver circuit 210. Instead, the detection of an error in the configuration data will automatically cause the driver core 208 to be held in a default mode of operation that precludes generation of an active lock signal (LOCK) at an output pin of the packaged device (see, e.g., pages 6 and 11 of the IDT attached datasheet). This default mode of operation may include holding the PLL within the driver core 208 at a minimum clock frequency and precluding phase lock by the PLL. Precluding phase lock may operate to inform another "master" device (not shown) that the driver circuit 210 (e.g., "slave" device) needs to be reprogrammed to correct the detected error. Such reprogramming operations may be performed in response to issuance of a program write command and new configuration data by the master device. Alternatively, the master device may issue a program restore command to the driver circuit 210, which causes another internal downloading of the configuration data from the nonvolatile memory 202 to the volatile registers within the programming registers and control logic 206. Still further operations performed by the control circuit may include automatically performing error correction operations on the configuration data once an error has been detected during a program restore operation. In such cases, the error check word may be generated using a conventional Hamming code that supports at least single bit error correction.

In some cases, the program restore command may result in a writing of erroneous data into the volatile program registers, however, this erroneous data will be blocked from influencing performance of the programmable clock driver circuit 210. Instead, the detection of an error in the configuration data will automatically cause the driver core 208 to be held in a default mode of operation that precludes generation of an active lock signal (LOCK) at an output pin of the packaged device (see, e.g., pages 6 and 11 of the attached datasheet). This default mode of operation may include holding the PLL within the driver core 208 at a minimum clock frequency and precluding phase lock by the PLL. Precluding phase lock may operate to inform another "master" device (not shown) that the driver circuit 210 (e.g., "slave" device) needs to be reprogrammed to correct the detected error. Such reprogramming operations may be performed in response to issuance of a program write command and new configuration data by the master device. Alternatively, the master device may issue a program restore command to the driver circuit 210, which causes another internal downloading of the configuration data from the nonvolatile memory 202 to the volatile registers within the programming registers and control logic 206. Still further operations performed by the control circuit may include automatically performing error correction operations on the configuration data once an error has been detected during a program restore operation. In such cases, the error check word may be generated using a conventional Hamming code that supports at least single bit error correction.

Figure 7:
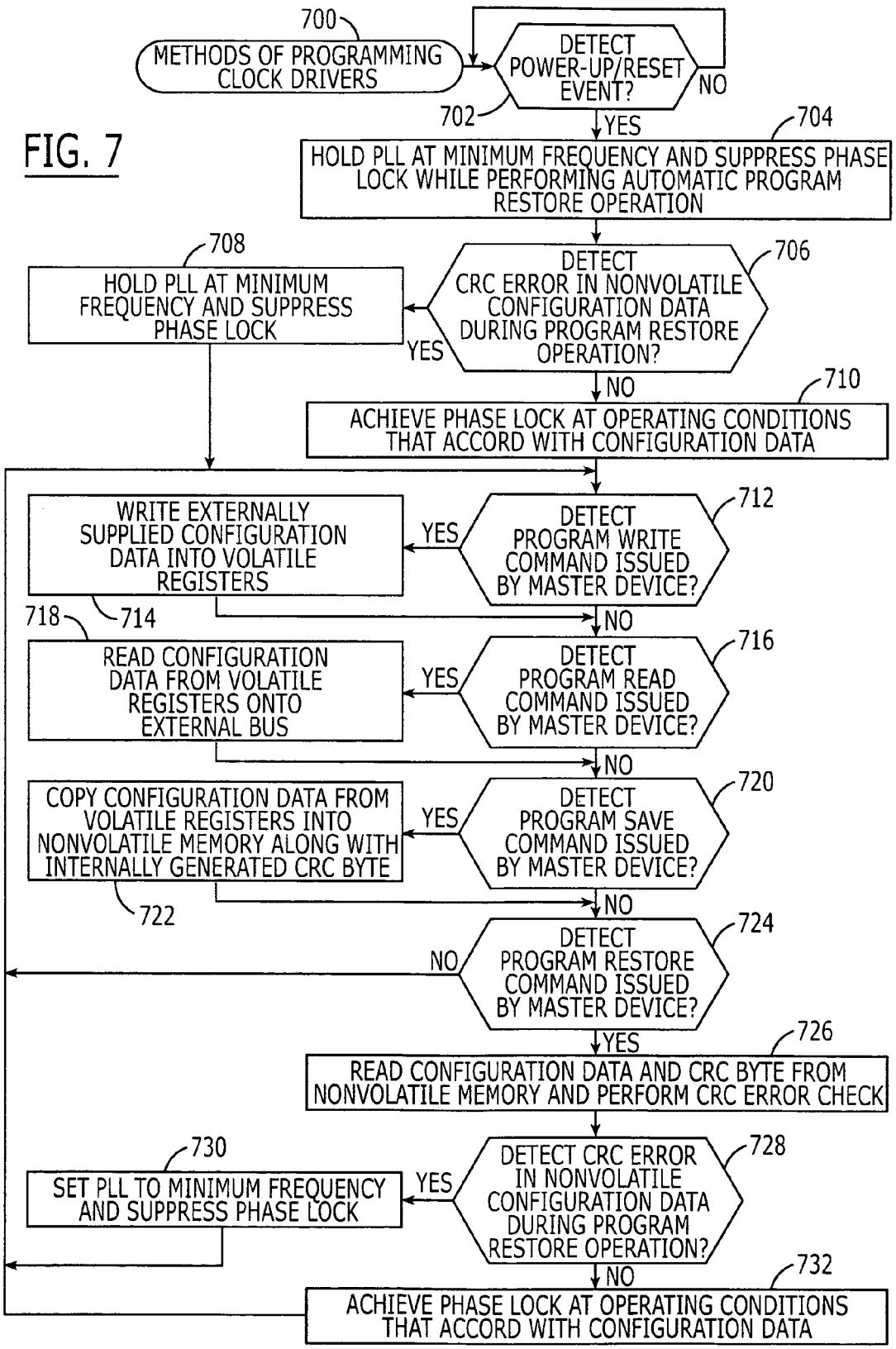
FIG. 7 is a flow diagram that illustrates operations performed by the programmable clock driver system of FIG. 6A.

The above described operations performed by the packaged integrated circuit device 200 are illustrated by the flow diagram of FIG. 7. In particular, FIG. 7 illustrates methods of programming clock drivers 700. These methods include an operation to detect a power-up or global reset event 702. The occurrence of a power-up/reset event, Block 702, causes the device 200 to perform an automatic program restore operation, Block 704. During this operation, the PLL clock driver core 208 is held at a minimum frequency and phase lock is suppressed (i.e., LOCK=0). The automatic program restore operation includes an operation to read configuration data (e.g., 12 bytes at 8 bits/byte) and a previously stored CRC check byte (e.g., 8 bits) from the nonvolatile memory 202 and write the configuration data into the volatile registers within the clock driver circuit 210. During this operation, an updated CRC check byte was automatically computed from the configuration data that is read from the nonvolatile memory 202. This updated CRC check byte is compared to the CRC check byte that is read from the nonvolatile memory 202 to identify whether a difference is present between the configuration data that was written to the nonvolatile memory 202 in response to a program save command and the configuration data that was read from the nonvolatile memory 202 in response to an automatic program restore operation. The detection of a difference represents the presence of an error in the configuration data, Block 706. In response to this error, the nonvolatile memory controller 204 and programmable registers and control logic 206 operate to hold the PLL clock driver core 208 in a default setting that maintains the PLL at a minimum frequency and precludes phase lock, Block 708. Alternatively, the failure to detect an error during the automatic program restore operation causes the PLL clock driver core 208 to operate in accordance with the configuration data and achieve phase lock, Block 710.

As illustrated by Blocks 712, 716, 720 and 724, after a power-up/reset event, the clock driver circuit 210 is responsive to a plurality of commands issued by a master device (not shown). The receipt of a write command issued by the master device is accompanied by new configuration data that is written into the volatile registers within the clock driver circuit 210, Block 714. Likewise, the receipt of a read command issued by the master device results in a reading of the configuration data from the volatile registers to an interface (e.g., JTAG/I²C interface/bus) of the packaged integrated circuit device 200, Block 718. The receipt of a program save command (ProgSave) from the master device results in a copying of the configuration data (within the volatile registers) to the nonvolatile memory 202 (e.g., EEPROM). These program save operations include writing the nonvolatile memory 202 with the configuration data and an internally generated error check word (e.g., CRC byte) that is computed from the configuration data, Block 722. In some embodiments, the configuration data may represent 12 bytes of data (i.e., 96 bits of data) and error check word may be defined by a single 8-bit byte.

The issuance of a program restore command by the master device causes the packaged integrated circuit device 200 to undergo operations similar to the automatic program restore operations described above with respect to Blocks 706, 708 and 710. As illustrated by Block 726, the configuration data is transferred from the nonvolatile memory 202 to the volatile registers. An error check operation (e.g., CRC error check) is also performed in the nonvolatile memory controller 204. This operation includes generating a new error check word and comparing the new error check word against the one read from the nonvolatile memory. If an error is detected, Block 728, the PLL clock driver core 208 is set to a default operating level and phase lock is prevented, Block 730. Otherwise, the clock driver circuit 210 is operated in accordance with the configuration data and a new phase lock condition is established, Block 732.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A packaged integrated circuit device, comprising:
a nonvolatile memory device; and
a programmable clock driver circuit communicatively coupled to said nonvolatile memory device, said programmable clock driver circuit having a control circuit and at least one clock generator therein, said control circuit configured to receive configuration data from said nonvolatile memory and further configured to idle the at least one clock generator in response to detecting an error in the configuration data.

2. The device of claim 1, wherein the at least one clock generator comprises a phase-locked loop (PLL) integrated circuit.

3. The device of claim 1, wherein said programmable clock driver circuit further comprises volatile registers that are configured to store the configuration data; and wherein said control circuit is further configured to read the configuration data from the volatile registers, generate at least one error check word from the configuration data and program said nonvolatile memory with the configuration data and the at least one error check word, in response to a program save command received by the device.

4. The device of claim 2, wherein said programmable clock driver circuit is configured to generate a lock indication signal that identifies whether or not the PLL integrated circuit is locked; and wherein the lock indication signal reflects a continuous unlocked state of the PLL integrated circuit when the at least one clock generator is idled in response to detecting the error in the configuration data.

5. The device of claim 3, wherein said control circuit is further configured to read the configuration data and the at least one error check word from said nonvolatile memory device in response to a program restore command received by the device; and wherein the at least one error check word is a cyclic redundancy check (CRC) word.

6. The device of claim 1, wherein said programmable clock driver circuit further comprises volatile registers that are configured to store the configuration data; and wherein said control circuit is further configured to:
read the configuration data from the volatile registers, generate a first error check word from the configuration data and program said nonvolatile memory with the configuration data and the first error check word, in response to a program save command received by the device; and
read the configuration data and the first error check word from said nonvolatile memory device, generate a second error check word from the configuration data that is read from said nonvolatile memory device and compare the first and second error check words against each other to detect the presence of a configuration data error, in response to a program restore command received by the device.

7. The device of claim 6, wherein the first error check word is a cyclic redundancy check (CRC) word.

8. The device of claim 7, wherein the configuration data consists of N bytes of data and the first error check word has a length equivalent to one of the N bytes of data.

9. A packaged integrated circuit device, comprising:
a first integrated circuit chip comprising an EEPROM memory device; and
a programmable clock driver chip communicatively coupled to said first integrated circuit chip, said programmable clock driver chip having a plurality of volatile registers, a control circuit and a clock generator therein, said control circuit configured to check configuration data received from the EEPROM memory device for errors during an operation to restore the volatile registers with the configuration data and further configured to dispose the clock generator in a default mode of operation in an event the configuration data contains at least one error.

10. The device of claim 9, wherein said control circuit is further configured to correct an error in the configuration data during the operation to restore the volatile registers with the configuration data.

11. An integrated circuit device, comprising:
a nonvolatile memory device; and
a programmable clock driver circuit communicatively coupled to said nonvolatile memory device, said programmable clock driver circuit having a control circuit and at least one clock generator therein, said control circuit configured to detect an error in configuration data received from said nonvolatile memory and further configured to idle the at least one clock generator in response to detecting the error in the configuration data.

12. The device of claim 11, wherein the at least one clock generator comprises a phase-locked loop (PLL) integrated circuit.

13. The device of claim 11, wherein said programmable clock driver circuit further comprises volatile registers that are configured to store the configuration data; and wherein said control circuit is further configured to read the configuration data from the volatile registers, generate at least one error check word from the configuration data and program said nonvolatile memory with the configuration data and the at least one error check word, in response to a program save command received by the device.

14. The device of claim 12, wherein said programmable dock driver circuit is configured to generate a lock indication signal that identifies whether or not the PLL integrated circuit is locked; and wherein the lock indication signal reflects a continuous unlocked state of the PLL integrated circuit when the at least one clock generator is idled in response to detecting the error in the configuration data.

15. The device of claim 13, wherein said control circuit is further configured to read the configuration data and the at least one error check word from said nonvolatile memory device in response to a program restore command received by the device; and wherein the at least one error check word is a cyclic redundancy check (CRC) word.

16. The device of claim 11, wherein said programmable clock driver circuit further comprises volatile registers that are configured to store the configuration data; and wherein said control circuit is further configured to:
  read the configuration data from the volatile registers, generate a first error check word from the configuration data and program said nonvolatile memory with the configuration data and the first error check word, in response to a program save command received by the device; and
  read the configuration data and the first error check word from said nonvolatile memory device, generate a second error check word from the configuration data that is read from said nonvolatile memory device and compare the first and second error check words against each other to detect the presence of a configuration data error, in response to a program restore command received by the device.

17. The device of claim 16, wherein the first error check word is a cyclic redundancy check (CRC) word.

18. The device of claim 17, wherein the configuration data consists of N bytes of data and the first error check word has a length equivalent to one of the N bytes of data.

19. A packaged integrated circuit device, comprising:
  a first integrated circuit chip comprising a nonvolatile memory device; and
  a second integrated circuit chip communicatively coupled to said first integrated circuit chip in a manner that supports bidirectional transfer of configuration data between the nonvolatile memory device and said second integrated circuit chip, said second integrated circuit chip having a control circuit and a programmable logic circuit therein, said control circuit configured to detect an error in configuration data received from the nonvolatile memory device during an operation to program the programmable logic circuit with the configuration data and further configured to dispose at least a portion of the programmable logic circuit in a default mode of operation in an event an error in the configuration data is detected.

20. A packaged integrated circuit device, comprising:
  a programmable clock driver circuit having a control circuit and at least one clock generator therein, said programmable clock driver circuit configured to store configuration data therein that sets at least one operating characteristic of the at least one clock generator and said control circuit configured to detect at least one error in the configuration data and idle the at least one clock generator in response to detecting the at least one error in the configuration data.

* * * * *